United States Patent
Keil et al.

(10) Patent No.: US 11,847,348 B2
(45) Date of Patent: Dec. 19, 2023

(54) MULTI-ACTIVATION TECHNIQUES FOR PARTIAL WRITE OPERATIONS

(71) Applicant: Apple Inc., Cupertino, CA (US)

(72) Inventors: Shane J. Keil, San Jose, CA (US); Gregory S. Mathews, Saratoga, CA (US); Lakshmi Narasimha Murthy Nukala, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 94 days.

(21) Appl. No.: 17/410,657

(22) Filed: Aug. 24, 2021

(65) Prior Publication Data

US 2023/0068494 A1 Mar. 2, 2023

(51) Int. Cl.
*G06F 3/06* (2006.01)

(52) U.S. Cl.
CPC .......... *G06F 3/0659* (2013.01); *G06F 3/0604* (2013.01); *G06F 3/0676* (2013.01); *G06F 3/0677* (2013.01); *G06F 3/0679* (2013.01)

(58) Field of Classification Search
CPC .... G06F 3/0659; G06F 3/0604; G06F 3/0676; G06F 3/0677; G06F 3/0679; G06F 3/0613; G06F 3/0611; G06F 3/061; G06F 3/0653; G06F 3/0644; G06F 3/0631; G06F 3/0658; G06F 3/0655; G06F 3/0625; G06F 2212/1016; G06F 2212/1021; G06F 2212/1024; G06F 13/00; G06F 13/1673; G11C 11/409; G11C 7/1006; G11C 7/1009; G11C 7/1042; G11C 7/1045
See application file for complete search history.

(56) References Cited

U.S. PATENT DOCUMENTS

| | | | |
|---|---|---|---|
| 8,438,344 B2 | 5/2013 | Kumar et al. | |
| 10,642,684 B1 | 5/2020 | MacLaren et al. | |
| 2006/0036817 A1 | 2/2006 | Oza et al. | |
| 2006/0112321 A1* | 5/2006 | Leung | G06F 11/1056 714/E11.051 |
| 2016/0139837 A1* | 5/2016 | Welker | G06F 3/0673 711/155 |
| 2017/0161144 A1* | 6/2017 | Reed | G06F 11/106 |
| 2018/0074704 A1* | 3/2018 | Teh | G06F 3/0656 |
| 2018/0211697 A1* | 7/2018 | Teh | G06F 13/1631 |

(Continued)

*Primary Examiner* — Rocio Del Mar Perez-Velez
*Assistant Examiner* — Tong B. Vo
(74) *Attorney, Agent, or Firm* — Kowert, Hood, Munyon, Rankin & Goetzel, P.C.; Michael B. Davis; Dean M. Munyon

(57) ABSTRACT

Techniques are disclosed relating to multi-activation techniques for wire operations with multiple partial writes. In some embodiments, a memory controller is configured to access data in a memory device that supports partial writes having a first size using read-modify-write operations and non-partial writes having a second size that is greater than the first size. In some embodiments, the memory controller is configured to queue a first write operation having the second size, where the first write operation includes multiple partial writes. In some embodiments, the memory controller is configured to send separate activate signals to the memory device to activate a bank of the memory device to perform different proper subsets of the multiple partial writes. This may allow interleaving of other accesses to a memory bank and merging of writes while waiting for a current activation, in some embodiments.

17 Claims, 8 Drawing Sheets

(56) References Cited

U.S. PATENT DOCUMENTS

2020/0050396 A1\*  2/2020   Keil ................... G06F 13/1621
2020/0371918 A1\*  11/2020  Chachad ............ G06F 12/0815
2021/0157721 A1    5/2021  Kim et al.
2022/0188029 A1\*  6/2022   Song ....................... G06F 3/061

\* cited by examiner

Queue a first write operation having a second size, where the first write operation includes multiple partial writes and where the memory accesses data in a memory device that supports:
- partial writes having a first size using read-modify-write operations; and
- non-partial writes having the second size, wherein the second size is greater than the first size

510

Send separate activate signals to the memory device to activate a bank of the memory device to perform different proper subsets of the multiple partial writes
520

FIG. 5

MULTI-ACTIVATION TECHNIQUES FOR PARTIAL WRITE OPERATIONS

BACKGROUND

Technical Field

This disclosure relates generally to computer memory operations and more particularly to write operations that include multiple partial writes.

Description of the Related Art

Memory devices often support partial writes, which may use a substantial number of cycles to complete, e.g., because the memory device performs a read-modify-write operation to add the new write data to the data already stored at the write location. For an N-byte partial write, an N-bit field may indicate whether each byte is to be written with new data or if the previously-stored byte should remain.

Memory controllers typically implement write queues that store data to be written to a memory device. A write operation handled by a memory controller may be a wider operation (e.g., a 128-byte operation), but the maximum size supported by a memory device for partial writes may be smaller (e.g., 32 bytes). Therefore, a given write operation may include multiple partial writes to the same memory bank.

BRIEF DESCRIPTION OF THE DRAWINGS

FIG. 5 is a flow diagram illustrating another example method, according to some embodiments.

DETAILED DESCRIPTION

As discussed above, in some embodiments a write queue may store writes of a particular size that is greater than partial writes supported by a memory device. Thus, a given write queue entry may store multiple partial writes. Partial writes typically use substantially more cycles than non-partial writes, due to performing a read-modify-write instead of just a write operation in the DRAM. If a single activate command to the memory device is used for multiple partial writes to the same bank, other accesses to the bank may be substantially delayed while waiting for the partial writes to perform sequentially.

Disclosed techniques utilize multiple activations to perform different partial writes within an overall write operation. This may advantageously allow interleaving of bank activations for other memory accesses (rather than those accesses needing to wait for all of the partial writes), which may provide finer scheduling granularity to improve performance, allow turning to the read direction more quickly, etc. Further, disclosed techniques may advantageously allow combining with subsequent writes, which may reduce partial writes (e.g., when a merge of two or more writes transforms a partial write into a full write while it is waiting in the write queue) which may in turn improve performance.

Example Memory Controller

Figure 1:
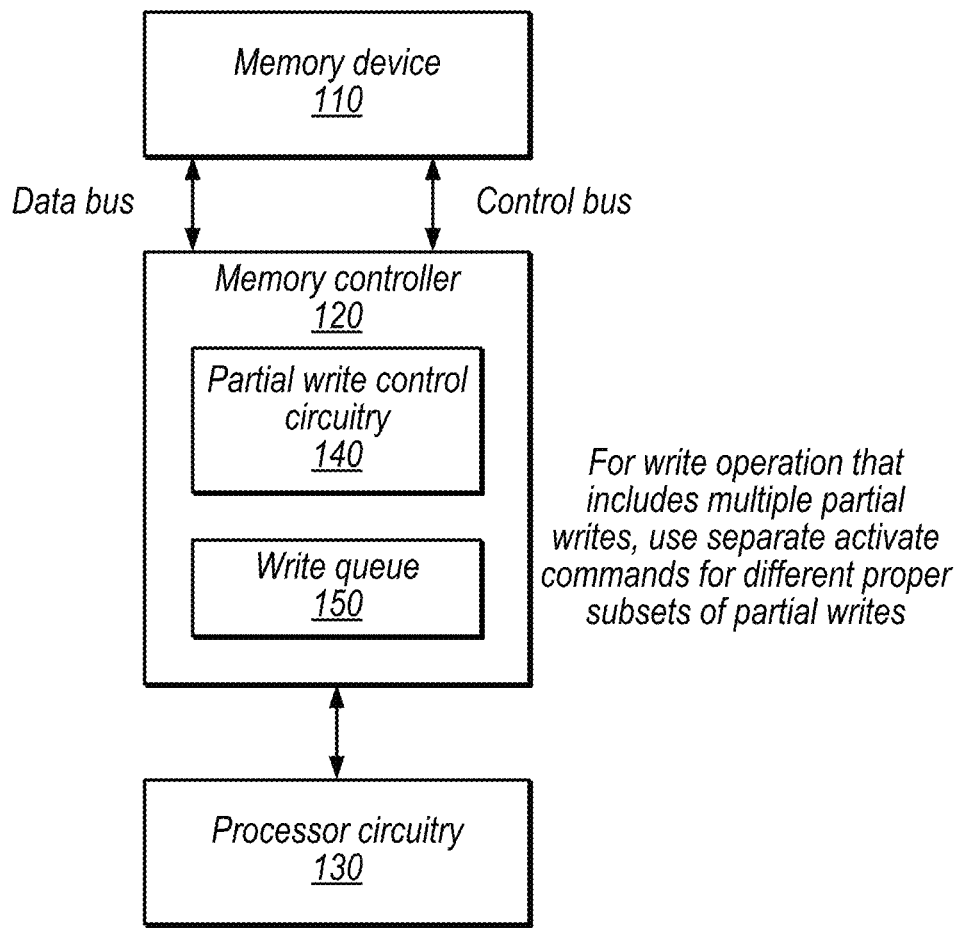
FIG. 1 is a block diagram illustrating an example system that includes a memory controller with partial write control circuitry, according to some embodiments.

FIG. 1 is a block diagram illustrating an example memory controller with partial write control circuitry, according to some embodiments. In the illustrated embodiment, memory controller 120 communicates with processor circuitry 130, which requests memory accesses for memory device 110. Memory controller 120 controls the memory device via a data bus and a control bus to perform the requested accesses. Memory controller 120 includes partial write control circuitry 140 and write queue 150.

In some embodiments, for a write operation that includes multiple partial writes, partial write control circuitry 140 is configured to use separate activate commands for different proper subsets of partial writes. For example, partial write control circuitry 140 may use a separate activate command to memory device 110 via the control bus for each partial write of the write operation. As another example, partial write control circuitry 140 may use a separate activate command for every two partial writes of the write operation, and so on (e.g., where each activate is used for up to N partial writes of the write operation and N is less than the total number of partial writes of the write operation).

Processor circuitry 130 may communicate with memory controller 120 to perform memory access operations. Memory controller 120 may store write data, control information, or both in write queue 150. Information for writes may be stored in write queue 150 until they are completed. Processor circuitry 130, memory controller 120, or both may track and avoid hazards between memory accesses.

The various buses discussed herein may use various appropriate protocols and physical wiring. Note that the data and control bus of FIG. 1 are included for purposes of illustration, but are not intended to limit the scope of the present disclosure. These buses may be combined or various other buses may be implemented. In some embodiments, one or more of the buses used to communicate with memory device 110 are serial buses and other(s) are parallel buses.

Figure 2:
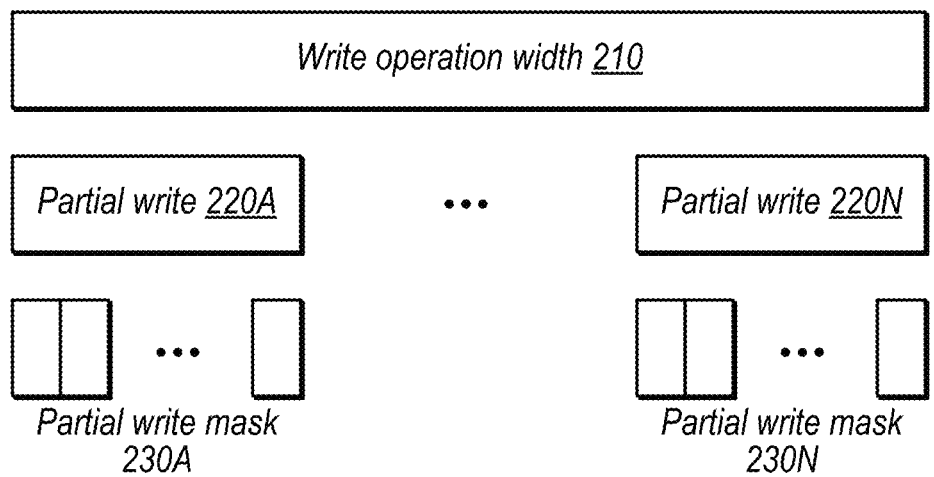
FIG. 2 is a diagram illustrating example width of a write operation that includes multiple partial writes, according to some embodiments.

FIG. 2 is a diagram illustrating example widths of a write operation and portions thereof, according to some embodiments. In the illustrated embodiment, the overall write operation (e.g., corresponding to an entry in write queue 150) has a width 210, e.g., of M data units. Memory controller 120 may be configured to perform a write operation of width 210 as a single write operation to memory device 110 if the write operations does not have any partial write operations. As discussed above, however, memory device 110 may support a greatest partial write size that is smaller (e.g., M/X data units where M and X are positive integers and X is greater than one). Therefore, a given write operation may include one or more partial writes 220A-220N having a smaller size. Each of these partial writes may be performed internally as a read-modify-write operation by memory device 110. As shown, partial write masks 230A-230N may indicate the portions of a given partial write operation 220 that are to be written with new data. The write masks may be communicated to the memory device 110 via the control bus, for example. In some embodiments, the mask information is transmitted via an address bus, e.g., in GDDR5 embodiments. In some embodiments, the mask information is transmitted via the data bus on DMI pins, e.g., in LPDDR5 embodiments. In some embodiments, the memory device supports mask information that specifies new/old data at multiple different granularities. Generally, write masks may be specified at various appropriate granularities in different embodiments.

In various embodiments, write queue 150 is configured to maintain information for an entry at least until all the data for the entry has been written. Thus, write queue 150 may store information for a given partial write even after other partial writes of the same overall operation have completed.

Figure 3:
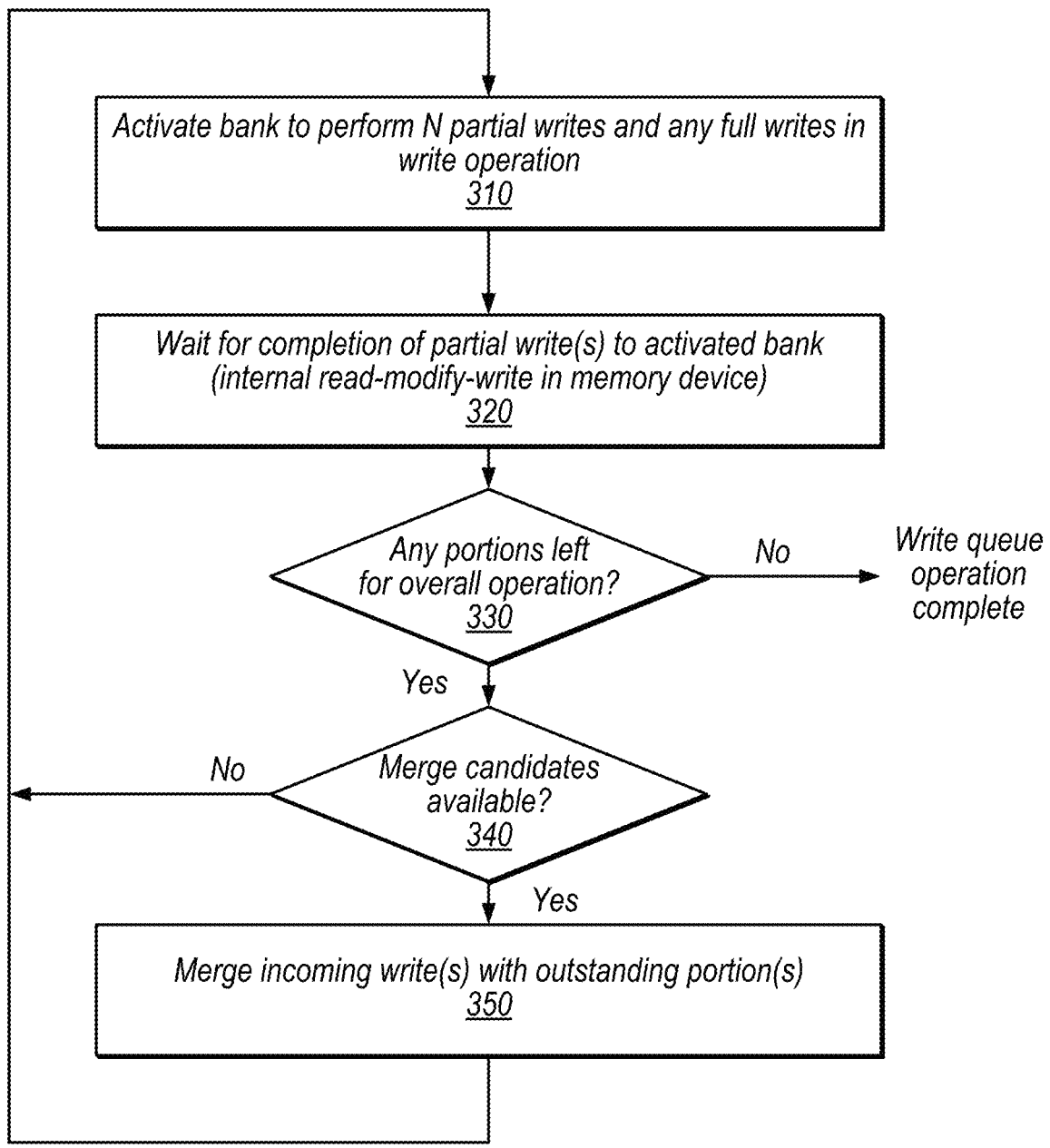
FIG. 3 is a flow diagram illustrating an example method for using separate bank activations for partial writes of the same overall write operation in a write queue entry, according to some embodiments.

FIG. 3 is a flow diagram illustrating an example method for performing a write operation with multiple partial writes, according to some embodiments. At 310, in the illustrated example, memory controller 120 activates a memory bank (e.g., a DRAM bank) to perform N partial writes and any full writes in the write operation. In some embodiments, N=1. In some embodiments, N is programmable. In various situations, N is smaller than the greatest potential number of partial writes included in the write operation.

The activate command may be encoded using an encoded address bus and a CS pin, for example. The activate command may be a row access command that opens up a row and moves the charge from its capacitors into sense amplifiers, in one or more RAM topologies. After an activate command, the row may remain open until a pre-charge command, allowing one or more read operations, write operations, or both to occur in the meantime.

At 320, in the illustrated example, memory controller 120 waits for completion of partial write(s) to the activated bank, while the memory device is performing an internal read-modify-write (along with waiting for any full writes to the same bank).

At 330, in the illustrated example, memory controller 120 determines whether there are any portions of the overall operation left. If not, the write operation is complete. Otherwise, flow proceeds to 340.

At 340, in the illustrated example, memory controller 120 determines if any merge candidates are available. For example, memory controller 120 may compare address information for one or more subsequent write operations with address information of entries in the write queue to determine if they access the same location. Memory controller 120 may also check whether merging would violate any dependencies that cannot be remedied. If there are no merge candidates, flow proceeds back to 310. Otherwise, flow proceeds to 350.

At 350, in the illustrated example, memory controller 120 merges one or more incoming writes with one or more outstanding portions of the write operation. For example, this may include overwriting write queue data from an earlier write with data from a later write, adjusting a partial write mask to reflect the combination of new and old data, etc. In the case of a partial write, the new data may fill the write, transforming the partial write to a full write. This may be allow a previously-partial write to proceed along with other partial write(s), potentially reducing the number of activations used for the overall write operation.

Figure 4:
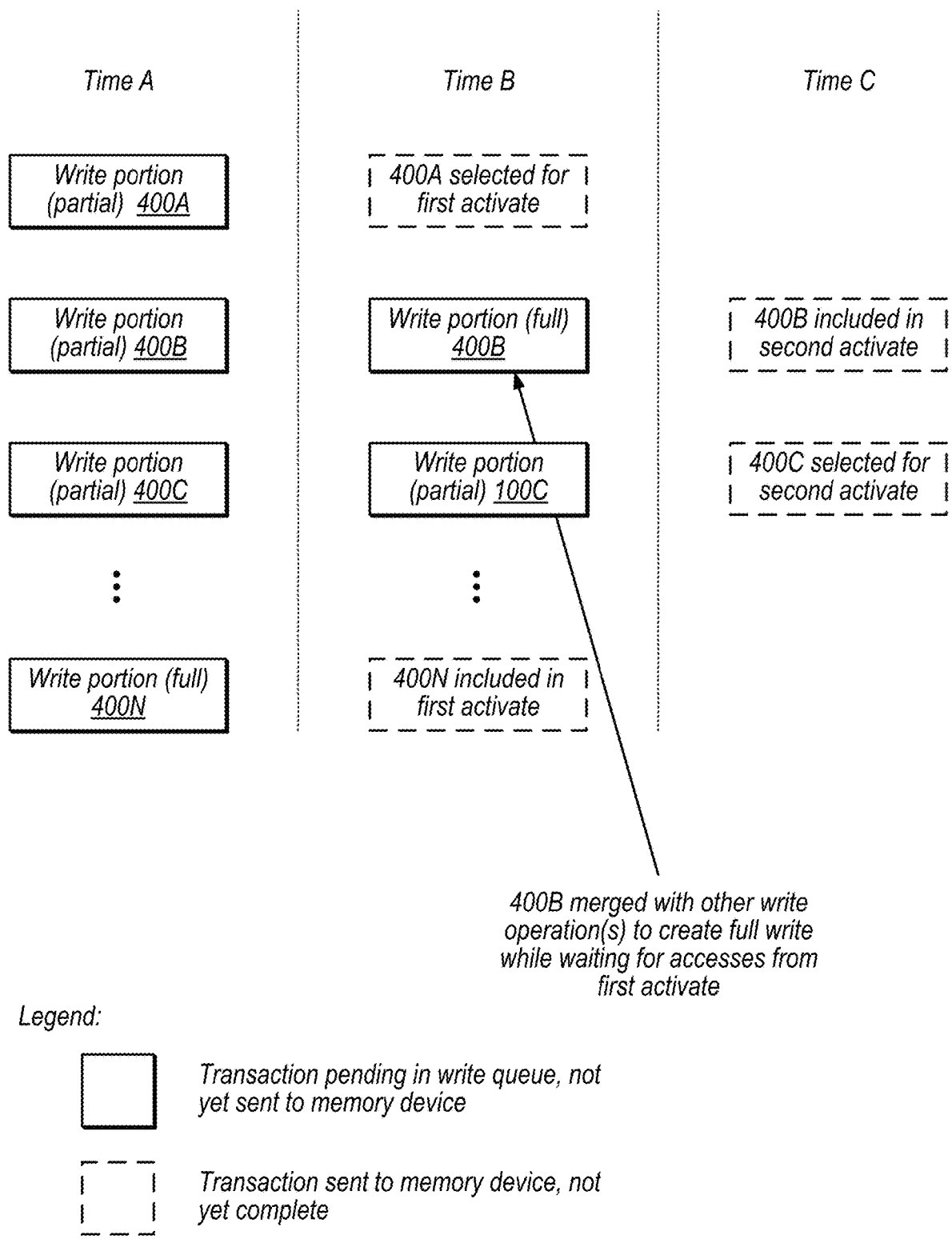
FIG. 4 is a diagram illustrating example status of a write queue entry at different times corresponding to different activations, according to some embodiments.

FIG. 4 shows an example write operation with merging, according to some embodiments. In the illustrated example at most one partial write is performed per activation. As shown in the legend, solid blocks represent transactions pending in the write queue that have not yet been sent to the memory device 110 while dashed blocks represent transactions that have been sent to the memory device 110 but are not yet complete.

At time A, multiple write portions 400A-400N are included in a write queue entry, with at least three partial writes. At time B, circuitry 140 has selected write portion 400A for the first activation and 400N is also included to be performed for this activation (along with any other non-partial portions). Memory controller 120 is waiting for the operations for the first activation to complete at this point. At time B, write portion 400B has become a full write because of merging with one or more other write operations.

At time C, write portion 400C is selected for a second activation and portion 400B is included in this second activation. As shown by this example, merging may reduce the number of activations used for a given write queue entry, because portion 400B transformed to a full write and does not use its own activation.

As discussed above, other operations may interleave between the first and second activations. For example, between time B and time C, memory controller 120 may activate the same bank for one or more other read operations, one or more other write operations, or both.

Example Method

FIG. 5 is a flow diagram illustrating an example method for performing a write operation with multiple partial writes, according to some embodiments. The method shown in FIG. 6 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 510, in the illustrated embodiment, memory controller circuitry queues a first write operation having a second size, where the first write operation includes multiple partial writes and where the memory accesses data in a memory device that supports: partial writes having a first size using read-modify-write operations and non-partial writes having the second size, wherein the second size is greater than the first size.

In some embodiments, the proper subsets respectively include a single partial write. In other embodiments, the proper subsets may include up to 2, 3, etc. partial writes.

In some embodiments, the memory controller circuitry initiates one or more available non-partial writes from the first write operation to the memory device to proceed during an activation caused by one of the separate activate signals. This may facilitate efficient performance of the overall write operation, given that non-partial writes may use substantially less cycles to complete than partial writes.

At 520, in the illustrated embodiment, the memory controller circuitry sends separate activate signals to the memory device to activate a bank of the memory device to perform different proper subsets of the multiple partial writes. In some embodiments, the memory controller circuitry asserts the activate signals in conjunction with a bank address register that indicates the bank of the memory device, a row address register that indicates a row of the bank, or both.

In some embodiments, the memory controller circuitry merges merge write data from another write operation with one or more of the multiple partial writes while waiting for an initiated proper subset of the multiple partial writes to complete.

In some embodiments, the memory controller circuitry interleaves one or more other accesses to the bank of the memory device between the separate activate signals for the first write operation.

In some embodiments, the memory controller circuitry includes a write queue that queues the first write operation, where one or more entries in the write queue are sized to store write operations that include up to four or more partial writes having the first size. In these embodiments, the write queue entries may be sized to store four partial writes, eight partial writes, etc.

Example Device

Figure 6:
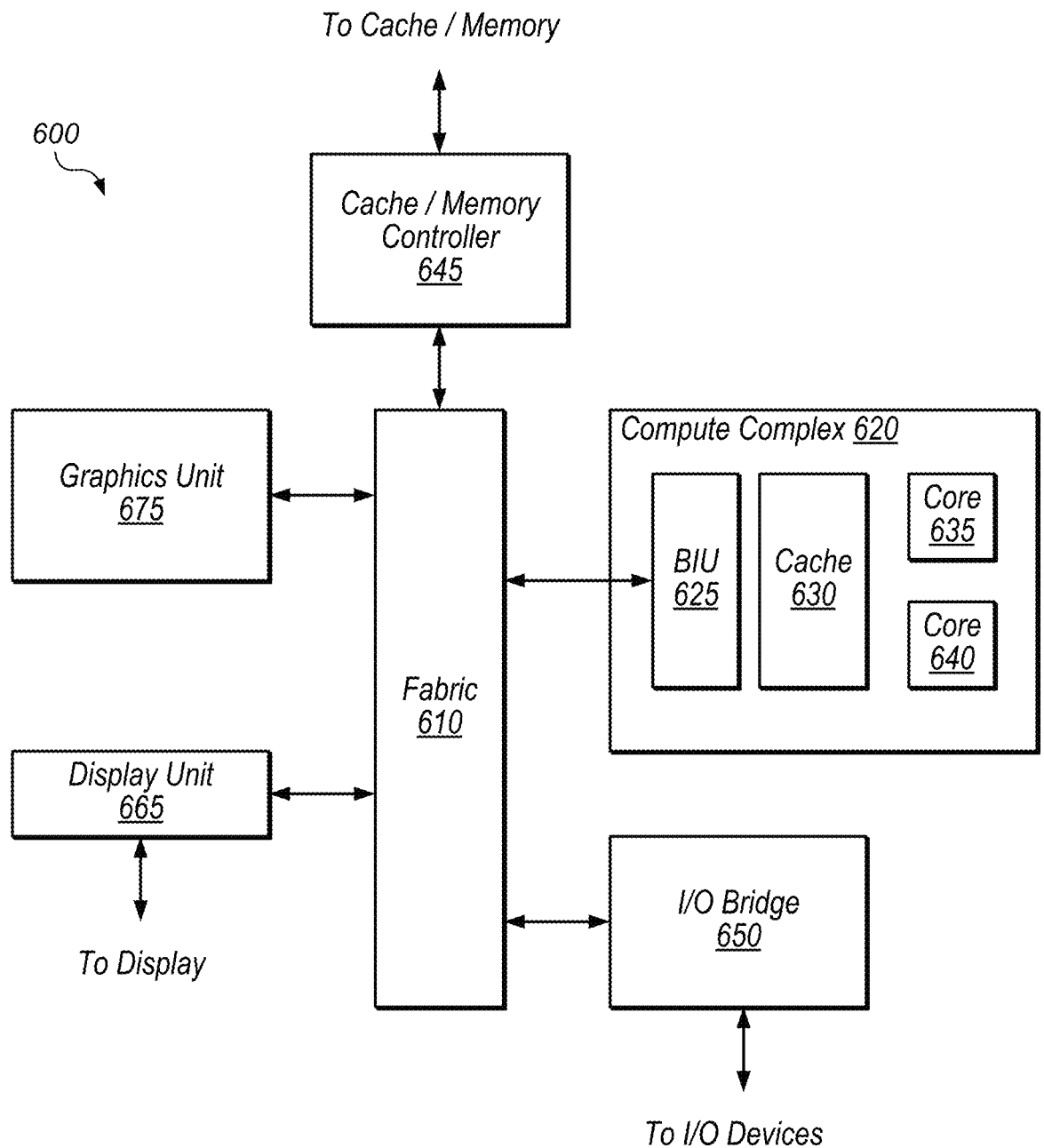
FIG. 6 is a block diagram illustrating an example computing device, according to some embodiments.

Referring now to FIG. 6, a block diagram illustrating an example embodiment of a device 600 is shown. In some embodiments, elements of device 600 may be included within a system on a chip. In some embodiments, device 600 may be included in a mobile device, which may be battery-powered. Therefore, power consumption by device 600 may be an important design consideration. In the illustrated embodiment, device 600 includes fabric 610, compute complex 620 input/output (I/O) bridge 650, cache/memory controller 645, graphics unit 675, and display unit 665. In some embodiments, device 600 may include other components (not shown) in addition to or in place of the illustrated components, such as video processor encoders and decoders, image processing or recognition elements, computer vision elements, etc.

Fabric 610 may include various interconnects, buses, MUX's, controllers, etc., and may be configured to facilitate communication between various elements of device 600. In some embodiments, portions of fabric 610 may be configured to implement various different communication protocols. In other embodiments, fabric 610 may implement a single communication protocol and elements coupled to fabric 610 may convert from the single communication protocol to other communication protocols internally.

In the illustrated embodiment, compute complex 620 includes bus interface unit (BIU) 625, cache 630, and cores 635 and 640. In various embodiments, compute complex 620 may include various numbers of processors, processor cores and caches. For example, compute complex 620 may include 1, 2, or 4 processor cores, or any other suitable number. In one embodiment, cache 630 is a set associative L2 cache. In some embodiments, cores 635 and 640 may include internal instruction and data caches. In some embodiments, a coherency unit (not shown) in fabric 610, cache 630, or elsewhere in device 600 may be configured to maintain coherency between various caches of device 600. BIU 625 may be configured to manage communication between compute complex 620 and other elements of device 600. Processor cores such as cores 635 and 640 may be configured to execute instructions of a particular instruction set architecture (ISA) which may include operating system instructions and user application instructions.

Cache/memory controller 645 may be configured to manage transfer of data between fabric 610 and one or more caches and memories. For example, cache/memory controller 645 may be coupled to an L3 cache, which may in turn be coupled to a system memory. In other embodiments, cache/memory controller 645 may be directly coupled to a memory. In some embodiments, cache/memory controller 645 may include one or more internal caches.

In some embodiments, cache/memory controller 645, one or more memory controllers of graphics unit 675 or compute complex 620, or some combination thereof, include partial write control circuitry 140 configured to use separate activations for partial writes of a given overall write operation. In various embodiments, this may improve performance of device 600 relative to traditional implementations.

As used herein, the term "coupled to" may indicate one or more connections between elements, and a coupling may include intervening elements. For example, in FIG. 6, graphics unit 675 may be described as "coupled to" a memory through fabric 610 and cache/memory controller 645. In contrast, in the illustrated embodiment of FIG. 6, graphics unit 675 is "directly coupled" to fabric 610 because there are no intervening elements.

Graphics unit 675 may include one or more processors, e.g., one or more graphics processing units (GPU's). Graphics unit 675 may receive graphics-oriented instructions, such as OPENGL®, Metal, or DIRECT3D® instructions, for example. Graphics unit 675 may execute specialized GPU instructions or perform other operations based on the received graphics-oriented instructions. Graphics unit 675 may generally be configured to process large blocks of data in parallel and may build images in a frame buffer for output to a display, which may be included in the device or may be a separate device. Graphics unit 675 may include transform, lighting, triangle, and rendering engines in one or more graphics processing pipelines. Graphics unit 675 may output pixel information for display images. Graphics unit 675, in various embodiments, may include programmable shader circuitry which may include highly parallel execution cores configured to execute graphics programs, which may include pixel tasks, vertex tasks, and compute tasks (which may or may not be graphics-related).

Display unit 665 may be configured to read data from a frame buffer and provide a stream of pixel values for display. Display unit 665 may be configured as a display pipeline in some embodiments. Additionally, display unit 665 may be configured to blend multiple frames to produce an output frame. Further, display unit 665 may include one or more interfaces (e.g., MIPI® or embedded display port (eDP)) for coupling to a user display (e.g., a touchscreen or an external display).

I/O bridge 650 may include various elements configured to implement: universal serial bus (USB) communications, security, audio, and low-power always-on functionality, for example. I/O bridge 650 may also include interfaces such as pulse-width modulation (PWM), general-purpose input/output (GPIO), serial peripheral interface (SPI), and inter-integrated circuit (I2C), for example. Various types of peripherals and devices may be coupled to device 600 via I/O bridge 650.

In some embodiments, device 600 includes network interface circuitry (not explicitly shown), which may be connected to fabric 610 or I/O bridge 650. The network interface circuitry may be configured to communicate via various networks, which may be wired, wireless, or both. For example, the network interface circuitry may be configured to communicate via a wired local area network, a wireless local area network (e.g., via WiFi), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth or WiFi Direct), etc. In various embodiments, the network interface circuitry may provide device 600 with connectivity to various types of other devices and networks.

Example Applications

Figure 7:
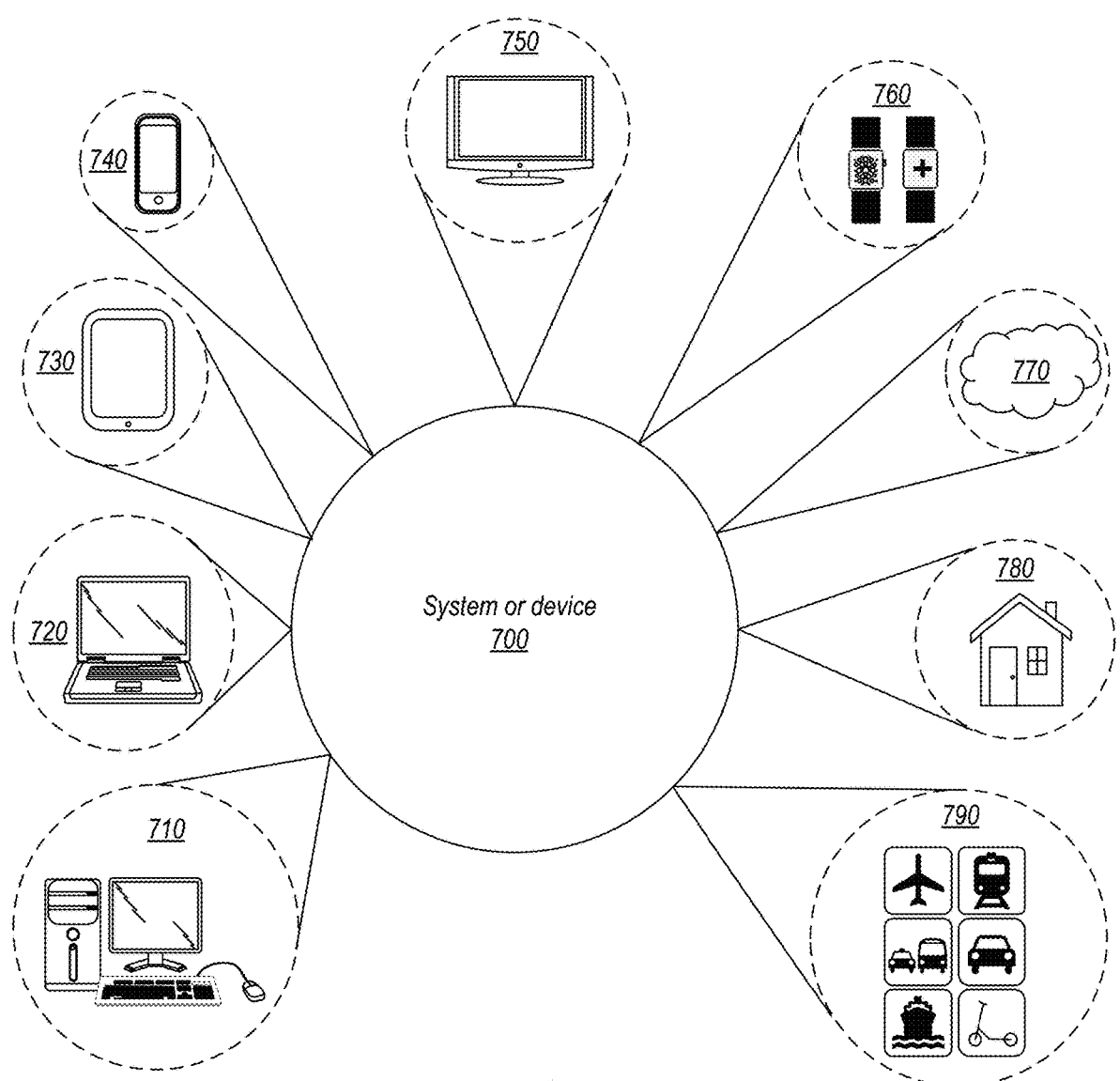
FIG. 7 is a diagram illustrating example applications of disclosed systems and devices, according to some embodiments.

Turning now to FIG. 7, various types of systems that may include any of the circuits, devices, or system discussed above. System or device 700, which may incorporate or otherwise utilize one or more of the techniques described herein, may be utilized in a wide range of areas. For example, system or device 700 may be utilized as part of the hardware of systems such as a desktop computer 710, laptop computer 720, tablet computer 730, cellular or mobile phone 740, or television 750 (or set-top box coupled to a television).

Similarly, disclosed elements may be utilized in a wearable device 760, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 700 may also be used in various other contexts. For example, system or device 700 may be utilized in the context of a server computer system, such as a dedicated server or on shared hardware that implements a cloud-based service 770. Still further, system or device 700 may be implemented in a wide range of specialized everyday devices, including devices 780 commonly found in the home such as refrigerators, thermostats, security cameras, etc. The interconnection of such devices is often referred to as the "Internet of Things" (IoT). Elements may also be implemented in various modes of transportation. For example, system or device 700 could be employed in the control systems, guidance systems, entertainment systems, etc. of various types of vehicles 790.

The applications illustrated in FIG. 7 are merely exemplary and are not intended to limit the potential future applications of disclosed systems or devices. Other example applications include, without limitation: portable gaming devices, music players, data storage devices, unmanned aerial vehicles, etc.

Example Computer-Readable Medium

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 8:
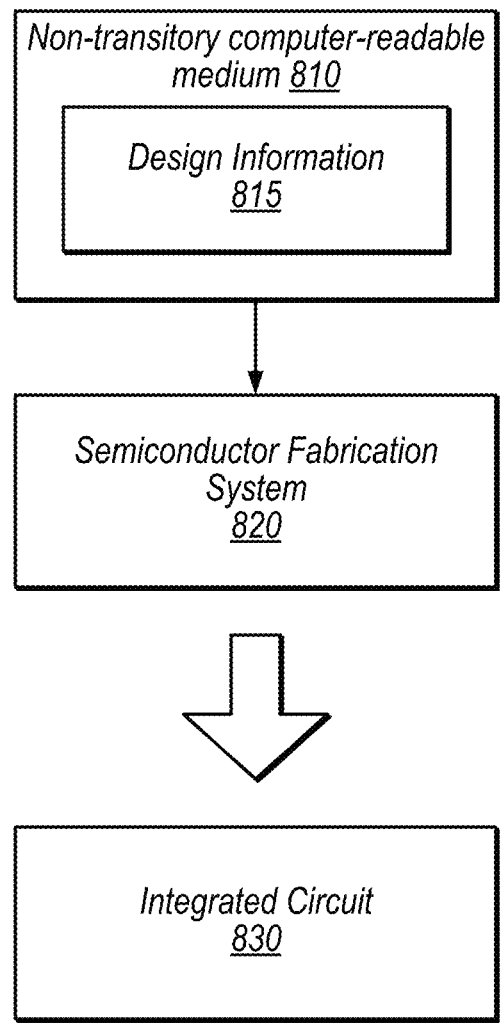
FIG. 8 is a block diagram illustrating an example computer-readable medium that stores circuit design information, according to some embodiments.

FIG. 8 is a block diagram illustrating an example non-transitory computer-readable storage medium that stores circuit design information, according to some embodiments. In the illustrated embodiment semiconductor fabrication system 820 is configured to process the design information 815 stored on non-transitory computer-readable medium 810 and fabricate integrated circuit 830 based on the design information 815.

Non-transitory computer-readable storage medium 810, may comprise any of various appropriate types of memory devices or storage devices. Non-transitory computer-readable storage medium 810 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 810 may include other types of non-transitory memory as well or combinations thereof. Non-transitory computer-readable storage medium 810 may include two or more memory mediums which may reside in different locations, e.g., in different computer systems that are connected over a network.

Design information 815 may be specified using any of various appropriate computer languages, including hardware description languages such as, without limitation: VHDL, Verilog, SystemC, SystemVerilog, RHDL, M, MyHDL, etc. Design information 815 may be usable by semiconductor fabrication system 820 to fabricate at least a portion of integrated circuit 830. The format of design information 815 may be recognized by at least one semiconductor fabrication system 820. In some embodiments, design information 815 may also include one or more cell libraries which specify the synthesis, layout, or both of integrated circuit 830. In some embodiments, the design information is specified in whole or in part in the form of a netlist that specifies cell library elements and their connectivity. Design information 815, taken alone, may or may not include sufficient information for fabrication of a corresponding integrated circuit. For example, design information 815 may specify the circuit elements to be fabricated but not their physical layout. In this case, design information 815 may need to be combined with layout information to actually fabricate the specified circuitry.

Integrated circuit 830 may, in various embodiments, include one or more custom macrocells, such as memories, analog or mixed-signal circuits, and the like. In such cases, design information 815 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 820 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 820 may also be configured to perform various testing of fabricated circuits for correct operation.

In various embodiments, integrated circuit 830 is configured to operate according to a circuit design specified by design information 815, which may include performing any of the functionality described herein. For example, integrated circuit 830 may include any of various elements shown in FIGS. 1 and 6. Further, integrated circuit 830 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure Le something physical). More specifically, this formulation is used to indicate that this structure is arranged to perform the one or more tasks during operation. A structure can be said to be "configured to" perform some task even if the structure is not currently being operated. Thus, an entity, described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed. FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:
1. An apparatus, comprising:
memory controller circuitry configured to:
  access data in a memory device that supports:
    partial writes having a first size using read-modify-write operations; and
    non-partial writes having a second size that is greater than the first size;
  queue a first write operation having the second size, wherein the first write operation includes multiple partial writes;
  send separate activate signals to the memory device to activate the same bank of the memory device to perform different proper subsets of the multiple partial writes; and
  initiate one or more available non-partial writes from the first write operation to the memory device such that the one or more non-partial writes proceed during an activation caused by one of the separate activate signals.
2. The apparatus of claim 1, wherein the proper subsets respectively include a single partial write.
3. The apparatus of claim 1, wherein the memory controller circuitry is further configured to:
  merge write data from another write operation with one or more of the multiple partial writes while waiting for an initiated proper subset of the multiple partial writes to complete.
4. The apparatus of claim 1, wherein the memory controller circuitry is further configured to:
  interleave one or more other accesses to the bank of the memory device between the separate activate signals for the first write operation.
5. The apparatus of claim 1, wherein the memory controller circuitry includes a write queue configured to queue the first write operation, wherein one or more entries in the write queue are sized to store write operations that include up to four or more partial writes having the first size.
6. The apparatus of claim 1, wherein the memory controller circuitry is configured to assert the activate signals in conjunction with a bank address register that indicates the bank of the memory device.
7. The apparatus of claim 1, wherein the memory controller circuitry is configured to provide mask information for partial writes to the memory device.
8. A non-transitory computer readable storage medium having stored thereon design information that specifies a design of at least a portion of a hardware integrated circuit in a format recognized by a semiconductor fabrication system that is configured to use the design information to produce the circuit according to the design, wherein the design information specifies that the circuit includes:
memory controller circuitry configured to:
  access data in a memory device that supports:
    partial writes having a first size using read-modify-write operations; and
    non-partial writes having a second size that is greater than the first size;
  queue a first write operation having the second size, wherein the first write operation includes multiple partial writes;
  send separate activate signals to the memory device to activate the same bank of the memory device to perform different proper subsets of the multiple partial writes; and
  initiate one or more available non-partial operations from the first write operation to the memory device such that the one or more non-partial operations proceed during an activation caused by one of the separate activate signals.
9. The non-transitory computer readable storage medium of claim 8, wherein the proper subsets respectively include a single partial write.
10. The non-transitory computer readable storage medium of claim 8, wherein the memory controller circuitry is further configured to:
  merge write data from another write operation with one or more of the multiple partial writes while waiting for an initiated proper subset of the multiple partial writes to complete.
11. The non-transitory computer readable storage medium of claim 8, wherein the memory controller circuitry is further configured to:
  interleave one or more other accesses to the bank of the memory device between the separate activate signals for the first write operation.
12. The non-transitory computer readable storage medium of claim 8, wherein the memory controller circuitry includes a write queue configured to queue the first write operation, wherein one or more entries in the write queue are sized to store write operations that include up to four or more partial writes having the first size.

13. The non-transitory computer readable storage medium of claim 8, wherein the activate signals are asserted in conjunction with a bank address register that indicates the bank of the memory device and a row address register that indicates a row of the bank.

14. A method, comprising:
 queuing, by memory controller circuitry, a first write operation having a second size, wherein the first write operation includes multiple partial writes, wherein the memory controller circuitry accesses data in a memory device that supports:
  partial writes having a first size using read-modify-write operations; and
  non-partial writes having the second size, wherein the second size is greater than the first size;
 sending, by the memory controller circuitry, separate activate signals to the memory device to activate the same bank of the memory device to perform different proper subsets of the multiple partial writes; and
 initiating, by the memory controller circuitry, one or more available non-partial operations from the first write operation to the memory device such that the one or more non-partial operations proceed during an activation caused by one of the separate activate signals.

15. The method of claim 14, further comprising:
 merging, by the memory controller circuitry, write data from another write operation with one or more of the multiple partial writes while waiting for an initiated proper subset of the multiple partial writes to complete.

16. The method of claim 14, further comprising:
 interleaving, by the memory controller circuitry, one or more other accesses to the bank of the memory device between the separate activate signals for the first write operation.

17. The method of claim 14, wherein the activate signals are asserted in conjunction with a bank address register that indicates the bank of the memory device.

\* \* \* \* \*